(12) United States Patent
Jeon

(10) Patent No.: US 7,202,721 B2
(45) Date of Patent: Apr. 10, 2007

(54) DELAY LOCKED LOOP AND SEMICONDUCTOR MEMORY DEVICE HAVING THE SAME

(75) Inventor: Young-Jin Jeon, Daejeon (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 11/265,945

(22) Filed: Nov. 3, 2005

(65) Prior Publication Data

US 2006/0097762 A1    May 11, 2006

(30) Foreign Application Priority Data

Nov. 8, 2004    (KR)    .................... 10-2004-0090599

(51) Int. Cl.
*H03K 7/00*    (2006.01)
(52) U.S. Cl. .................. 327/158; 327/160; 327/161
(58) Field of Classification Search .............. None
See application file for complete search history.

(56) References Cited

U.S. PATENT DOCUMENTS

| | | | | |
|---|---|---|---|---|
| 6,340,910 | B1 | 1/2002 | Saeki | 327/296 |
| 6,680,635 | B2 * | 1/2004 | Lee | 327/158 |
| 6,768,361 | B2 * | 7/2004 | Kwak | 327/158 |
| 6,911,853 | B2 * | 6/2005 | Kizer et al. | 327/158 |
| 2004/0080349 | A1 | 4/2004 | Kawahito et al. | 327/158 |
| 2005/0093600 | A1 * | 5/2005 | Kwak | 327/161 |

FOREIGN PATENT DOCUMENTS

| | | |
|---|---|---|
| JP | 2001-007686 | 1/2001 |
| KR | 10-2004-0044219 | 5/2004 |

* cited by examiner

*Primary Examiner*—Timothy P. Callahan
*Assistant Examiner*—An T. Luu
(74) *Attorney, Agent, or Firm*—Mills & Onello, LLP

(57) ABSTRACT

In a delay locked loop and a semiconductor memory device having the same, the delay locked loop includes a phase detecting and control signal generator for detecting a phase difference between a clock signal and a feedback clock signal and generating a plural-bit delay control signal which varies according to the phase difference; a first delay having a predetermined number of first delay cells which are cascade-connected for delaying the clock signal to generate a plurality of output clock signals and the feedback clock signal in response to the plural-bit delay control signal; a second delay having a predetermined number of second delay cells which are cascade-connected for delaying an inverted clock signal to generate a plurality of inverted output clock signals in response to the plural-bit delay control signal; and a phase mixer for phase-mixing corresponding clock signals among the plurality of output clock signals and the plurality of inverted output clock signals to output a plurality of corrected output clock signals.

36 Claims, 9 Drawing Sheets

DELAY LOCKED LOOP AND SEMICONDUCTOR MEMORY DEVICE HAVING THE SAME

CROSS-REFERENCE TO RELATED APPLICATION

This application claims the benefit of Korean Patent Application No. 2004-90599, filed Nov. 8, 2004, the disclosure of which is hereby incorporated herein by reference in its entirety.

BACKGROUND OF THE INVENTION

1. Field of the Invention

The present invention relates to a delay locked loop and, more particularly, to a delay locked loop which can generate a plurality of clock signals which have different phases from each other and a semiconductor memory device having the same.

2. Description of the Related Art

A delay locked loop is commonly employed in a control device and a semiconductor memory device to generate a plurality of clock signals which have different respective phases. Each device generates data strobe signals at a higher rate higher than externally applied clock signals using a plurality of clock signals generated from the delay locked loop and receives or outputs data in response to the data strobe signals.

FIG. 1 is a block diagram illustrating a conventional delay locked loop. The delay locked loop of FIG. 1 includes dividers 10 and 20, a phase detector 12, a first counter 14, a second counter 16, and a delay circuit 18. The delay circuit 18 includes delay cells 18-1 to 18-4 connected in a cascade configuration.

Functions of the components of FIG. 1 are explained below.

The divider 10 divides an externally applied clock signal CLK and generates a divided clock signal DCLK. The phase detector 12 detects a phase difference between a feedback clock signal FCLK and the divided clock signal DCLK at the initial stage and generates a first up signal CUP if a phase of the feedback clock signal precedes a phase of the divided clock signal DCLK and a first down signal CDN if a phase of the divided clock signal DCLK precedes a phase of the feedback clock signal. After the first down signal CDN is generated, the phase detector 12 generates a second up signal FUP if a phase of the feedback clock signal precedes a phase of the divided clock signal DCLK and a second down signal FDN if a phase of the divided clock signal DCLK precedes a phase of the feedback clock signal. That is, the phase detector 12 continuously generates the first up signal CUP at an initial stage until a phase difference between the feedback clock signal FCLK and the divided clock signal DCLK is within a predetermined range and then generates the second up signal FUP and the second down signal FDN. The first counter 14 performs an up count in response to the first up signal CUP to generate an m-bit first control signal CON1. The second counter 16 is enabled in response to the first down signal CDN, performs an up count in response to the second up signal FUP, and perform a down count in response to the second down signal FDN to perform an n-bit second control signal CON2. The delay circuit 18 receives a clock signal CLK and adjusts a delay time of the delay cells 18-1 and 18-2 in response to the m-bit first control signal CON1 and the n-bit second control signal CON2 to generate four clock signals CLK0, CLK90, CLK180, and CLK270 which have a phase difference of 90° from each other. The divider 20 divides the clock signal output from the delay 18 to generate the feedback clock signal FCLK.

However, the clock signals CLK0, CLK90, CLK180, and CLK270 generated from the conventional delay locked loop might not have an precise phase difference of 0°, 90°, 180°, and 270° due to transient phase change (noise) which results from variation of power voltage and external noise that occurs during operation.

SUMMARY OF THE INVENTION

It is an object of the present invention to provide a delay locked loop which can generate a plurality of clock signals which have a precise phase difference of 90° by offsetting transient phase change (noise) resulting from variation of power voltage.

It is another object of the present invention to provide a semiconductor memory device having a delay locked loop which can generate a plurality of clock signals which precisely have a precise phase difference of 90° by offsetting transient phase change (noise) resulting from variation of power voltage.

A first aspect of the inventive delay locked loop includes a phase detecting and control signal generator for detecting a phase difference between a clock signal and a feedback clock signal and generating a plural-bit delay control signal which varies according to the phase difference; a first delay having a predetermined number of first delay cells which are cascade-connected for delaying the clock signal to generate a plurality of output clock signals and the feedback clock signal in response to the plural-bit delay control signal; a second delay having a predetermined number of second delay cells which are cascade-connected for delaying an inverted clock signal to generate a plurality of inverted output clock signals in response to the plural-bit delay control signal; and a phase mixer for phase-mixing corresponding clock signals among the plurality of output clock signals and the plurality of inverted output clock signals to output a plurality of corrected output clock signals.

The phase detecting and control signal generator includes a first divider for dividing the clock signal to generate a divided clock signals; a second divider for dividing the feedback clock signal output from the first delay to generate a divided feedback clock signal; a phase detector for detecting a phase difference between the divided clock signal and the divided feedback clock signal to generate a phase detecting signal; and a counting portion for performing a counting operation in response to the phase detecting signal to generate the plural-bit control signal.

The phase detector generates as the phase detecting signal a first up signal if the divided clock signal precedes in phase the divided feedback clock signal and a first down signal if the divided feedback clock signal precedes in phase the divided clock signal, at an initial stage, and generates, after the first down signal is generated, a second up signal if the divided clock signal precedes in phase the divided feedback clock signal and a second down signal if the divided feedback clock signal precedes in phase the divided clock signal. The counting portion includes a first counter for performing an up counting operation in response to the first up signal to generate a predetermined-bit first control signal; and a second counter for being enabled in response to the first down signal, performing an up counting operation in response to the second up signal, and performing a down counting operation in response to the second down signal to generate a predetermined-bit second control signal; wherein the plural-bit control signal is comprised of the predetermined-bit first and second control signals.

Each of the predetermined number of first delay cells includes a first buffer for delaying an output signal of a previous delay cell; and a plurality of first switching transistor and first capacitor pairs which are parallel-connected to each other, the first switching transistor and first capacitor pair serially connected between an output end of the first buffer and a ground voltage, wherein each of the plurality of first switching transistors is switched in response to the predetermined-bit first control signal. Each of the predetermined number of second delay cells includes a second buffer for delaying an output signal of a previous delay cell; and a plurality of second switching transistor and second capacitor pairs which are parallel-connected to each other, the second switching transistor and second capacitor pair serially connected between an output end of the second buffer and a ground voltage, wherein each of the plurality of second switching transistors is switched in response to the predetermined-bit second control signal.

The first counter includes a predetermined number of first counting cells for generating respective bits of the predetermined-bit first control signal, wherein the first counting cells generate the predetermined-bit first control signals having a low level at an initial stage and perform up counting operation in response to the first up signal to increase the bit number of the predetermined-bit first control signal having a high level. Each of the predetermined number of first counting cells includes a latch for initially outputting data having a high level to a first node, inverting data of the first node and outputting to a second node, and inverting data of the second node and outputting to the first node; and a reset circuit for making the first node have a low level in response to the first up signal and a signal of the second node of a next counting cell.

The second counter includes a predetermined number of second counting cells for generating respective bits of the predetermined-bit second control signal, and the second counting cells generate the predetermined-bit second control signal an upper bit of which has a high level and a remainder of bits of which have a low level, are enabled in response to the first down signal, perform an up counting operation in response to the second up signal to increase the bit number of the predetermined-bit second control signal having a high level, and perform a down counting operation in response to the second down signal to reduce the bit number of the predetermined-bit second control signal having a high level. Each of the predetermined number of first counting cells includes a latch for initially outputting data having a high level to a first node, inverting data of the first node and outputting to a second node, and inverting data of the second node and outputting to the first node; a first reset circuit for making the first node have a low level in response to the first up signal and a signal of the second node of a next counting cell; a second reset circuit for making the second node have a low level in response to the second down signal and a signal of the first node of a previous counting cell; and an enable circuit for providing the first and second reset circuits with a low level in response to the first down signal.

A second aspect of the inventive delay locked loop includes a phase detecting and control signal generator for detecting a phase difference between a clock signal and a feedback clock signal and generating a control voltage which varies according to the phase difference; a first delay having a predetermined number of first delay cells which are cascade-connected for delaying the clock signal to generate a plurality of output clock signals and the feedback clock signal in response to the control voltage; a second delay having a predetermined number of second delay cells which are cascade-connected for delaying an inverted clock signal to generate a plurality of inverted output clock signals in response to the control voltage; and a phase mixer for phase-mixing corresponding clock signals among the plurality of output clock signals and the plurality of inverted output clock signals to output a plurality of corrected output clock signals.

The delay locked loop further includes a first divider for dividing the clock signal to generate a divided clock signals; a second divider for dividing the feedback clock signal output from the first delay to generate a divided feedback clock signal; a phase detector for detecting a phase difference between the divided clock signal and the divided feedback clock signal to generate a phase detecting signal; and a charge pump for performing pumping operation in response to the phase detecting signal to generate the control voltage.

Each of the predetermined number of first delay cells includes a first buffer and applies as a power voltage of the first buffer the control voltage to control a delay time. Each of the predetermined number of second delay cells includes a second buffer and applies as a power voltage of the second buffer the control voltage to control a delay time.

The phase mixer generates a plurality of corrected output clock signals by phase-mixing an output clock signal and an inverted output clock signal which have the same phase and different phase change among the plurality of output clock signals and the plurality of inverted output clock signals and includes a first current generator for generating a first current in response to first and second input signals; a second current generator for generating a second current in response to third and fourth input signals; a first current mirror for mirroring the first current to generate a third current; a second current mirror for mirroring the second current to generate a fourth current; a third current mirror for mirroring the fourth current to generate an output voltage, wherein among the plurality of output clock signals and the plurality of inverted output clock signals, an output clock signal and an inverted output clock signal which have the same phase and different phase change are the first and second input signals, and an output clock signal and an inverted output clock signal which have opposite phase and different phase change are the third and fourth input signals.

A first aspect of the inventive semiconductor memory device includes a delay locked loop for receiving a clock signal and an inverted clock signal to generate a plurality of corrected output clock signals; and an output data strobe signal generator for combining the plurality of corrected output clock signals to generate a plurality of output data strobe signals, wherein the delay locked loop includes a phase detecting and control signal generator for detecting a phase difference between the clock signal and a feedback clock signal and generating a plural-bit delay control signal which varies according to the phase difference; a first delay having a predetermined number of first delay cells which are cascade-connected for delaying the clock signal to generate a plurality of output clock signals and the feedback clock signal in response to the plural-bit delay control signal; a second delay having a predetermined number of second delay cells which are cascade-connected for delaying an inverted clock signal to generate a plurality of inverted output clock signals in response to the plural-bit delay control signal; and a phase mixer for phase-mixing corresponding clock signals among the plurality of output clock signals and the plurality of inverted output clock signals to output a plurality of corrected output clock signals.

A second aspect of the inventive semiconductor memory device includes a delay locked loop for receiving a clock signal and an inverted clock signal to generate a plurality of corrected output clock signals; and an output data strobe signal generator for combining the plurality of corrected output clock signals to generate a plurality of output data strobe signals, wherein the delay locked loop includes a phase detecting and control signal generator for detecting a phase difference between the clock signal and a feedback clock signal and generating a control voltage which varies according to the phase difference; a first delay having a predetermined number of first delay cells which are cascade-connected for delaying the clock signal to generate a plurality of output clock signals and the feedback clock signal in response to the control voltage; a second delay having a predetermined number of second delay cells which are cascade-connected for delaying an inverted clock signal to generate a plurality of inverted output clock signals in response to the control voltage; and a phase mixer for phase-mixing corresponding clock signals among the plurality of output clock signals and the plurality of inverted output clock signals to output a plurality of corrected output clock signals.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
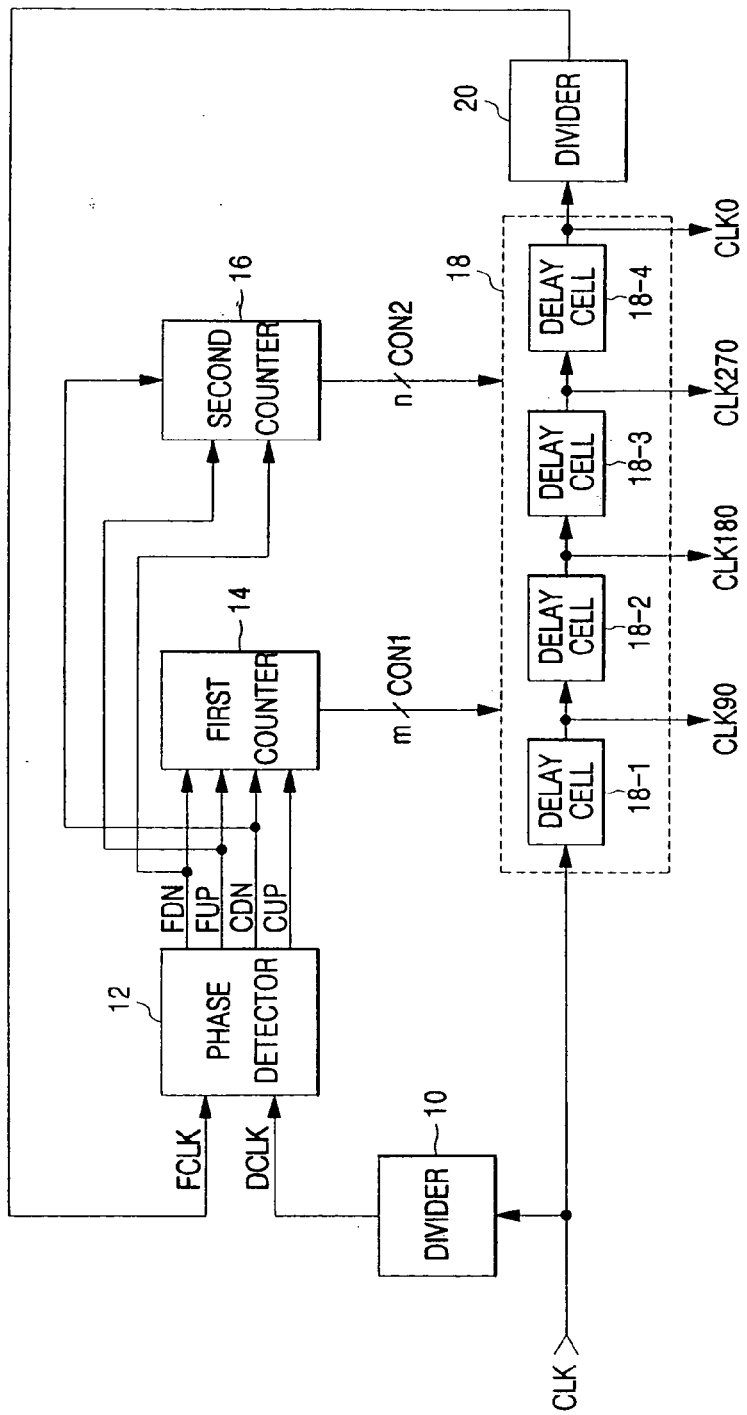
FIG. 1 is a block diagram illustrating a conventional delay locked loop.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2:
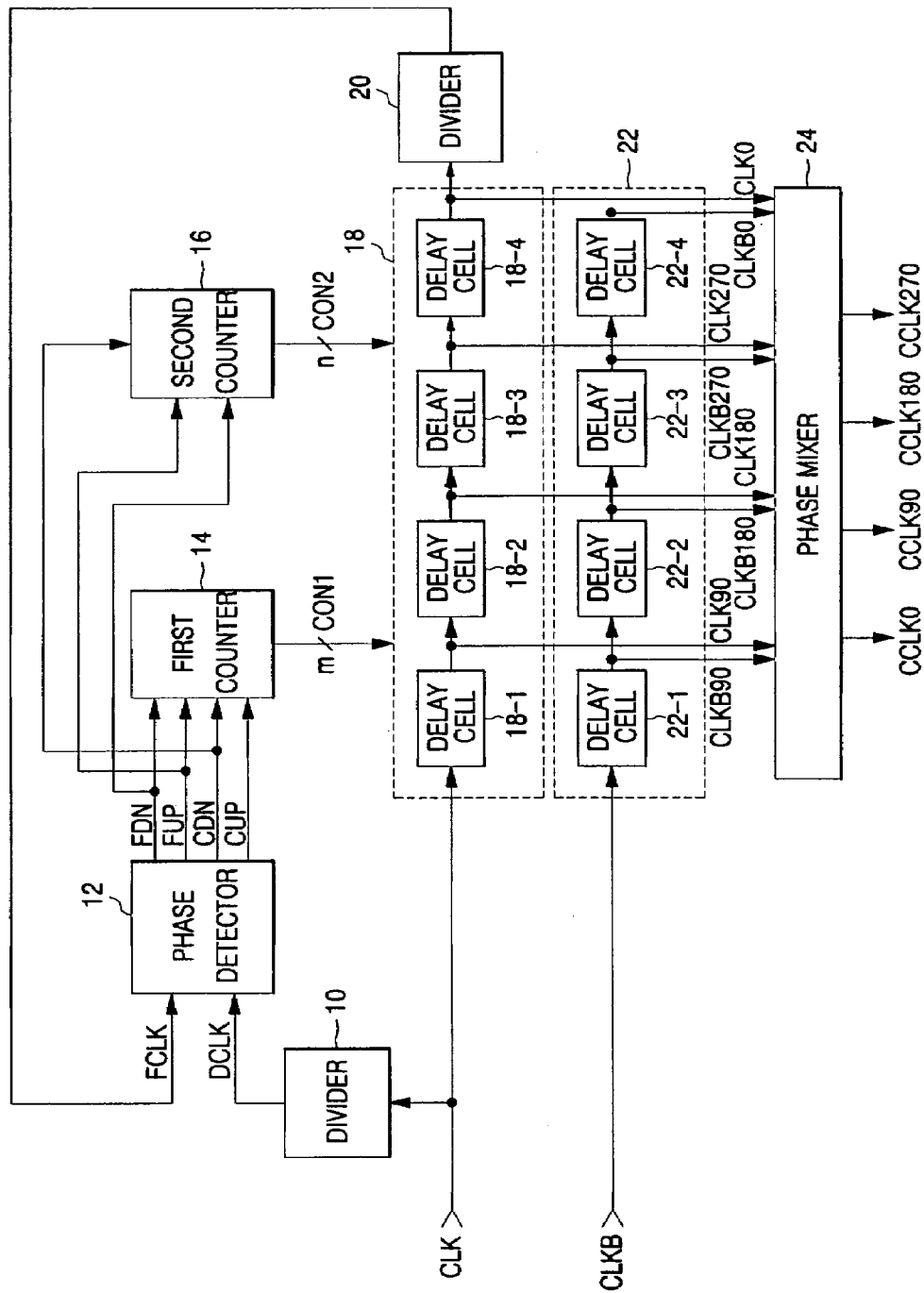
FIG. 2 is a block diagram illustrating a delay locked loop according to an embodiment of the present invention.

FIG. 2 is a block diagram illustrating a delay locked loop according to an embodiment of the present invention. The delay locked loop of FIG. 2 further includes a delay circuit 22 and a phase mixer 24 in addition to configuration of FIG. 1. The delay circuit 22 includes delay cells 22-1 to 22-4 connected in a cascade configuration.

Like reference numerals of FIGS. 1 and 2 denote like parts and perform like functions, and thus description of those is omitted.

The delay circuit 22 receives an inverted clock signal CLKB and controls a delay time of the delay cells 22-1 to 22-4 in response to the m-bit first control signal CON1 and the n-bit second control signal CON2 to generate four inverted clock signals CLKB0, CLKB90, CLKB180, and CLKB270 which have a phase difference of 90° with respect to each other. The phase mixer 24 receives the clock signals CLK0, CLK90, CLK180, and CLK270 and the inverted clock signals CLKB0, CLKB90, CLKB180, and CLKB270 and mixes corresponding clock signals and inverted clock signals to generate corrected clock signals CCLK0, CCLK90, CCLK180, and CCLK270.

Operation of the phase mixer 24 is explained below in detail.

The delay cells 18-1 to 18-4 and the delay cells 22-1 to 22-4 are connected to the same power voltage, and thus if variation occurs in the power voltage, the clock signals CLK0, CLK90, CLK180, and CLK270 undergo the same phase change (noise). For example, let us assume that the power voltage transiently varies, so that a phase change "α" occurs in all of the clock signals CLK90, CLK180, CLK270, CLKB90, CLK180, and CLKB270. Also, let us assume that the clock signals CLK180 and CLKB180 respectively have phases 0 and π since the clock signals CLK180 and CLKB180 have a phase difference of 180°. The clock signal CLK90 has a phase difference of $-\pi/2-\alpha$ from the clock signal CLK180, and the clock signal CLK270 has a phase difference of $\pi/2+\alpha$ from the clock signal CLK180. The clock signal CLKB90 has a phase difference of $\pi/2-\alpha$ from the clock signal CLKB180, and the clock signal CLK270 has a phase difference of $-\pi/2+\alpha$ from the clock signal CLKB180. The phase mixer 24 mixes phases of the clock signals CLK270 and CLKB90 to offset the phase change α and thus generates the corrected clock signal CCLK90 which has a phase difference of $\pi/2$ (90°) from the clock signal CLK180. Also, the phase mixer 24 mixes phases of the clock signals CLK90 and CLKB27 to offset the phase change α and thus generates the corrected clock signal CCLK270 which has a phase difference of $-\pi/2$ (270°) from the clock signal CLK180. If the reference clock signals are changed, the clock signals which are phase-mixed are likewise changed.

Accordingly, the phase mixer of the present invention mixes the clock signal and the inverted clock signal which are same in phase but different in phase change to offset the phase change, thereby generating the corrected clock signal.

Figure 3:
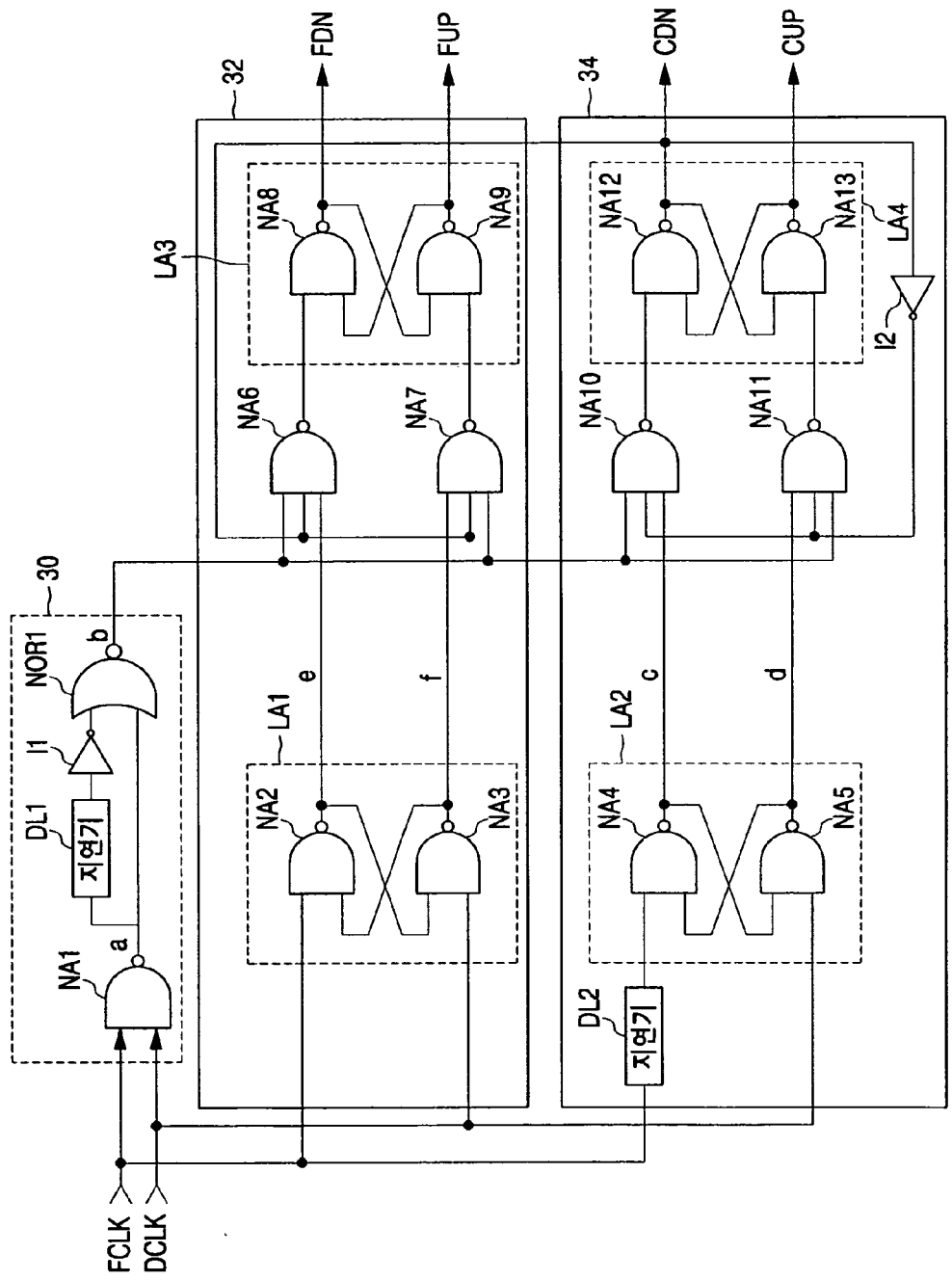
FIG. 3 is a circuit diagram illustrating a phase detector of the delay locked loop of FIG. 2.

FIG. 3 is a circuit diagram illustrating the phase detector of the delay locked loop of FIG. 2. The phase detector of FIG. 3 includes a pulse generator 30, a first phase detector 32, and a second phase detector 34. The pulse generator 30 includes a NAND gate NA1, a delay DL1, an inverter I1, and a NOR gate NOR1. The first phase detector 32 includes latches LA1 and LA3 and NAND gates NA6 and NA7. The second phase detector 34 includes latches LA2 and LA4, NAND gates NA10 and NA11 and an inverter I2. The latches LA1 to LA4 include two NAND gates NA2 and NA3, NA8 and NA9, NA4 and NA5, and NA12 and NA13, respectively.

Functions of the components of FIG. 3 are explained below.

The pulse generator 30 generates a signal b which transitions to a high level when both the feedback clock signal FCLK and the delay clock signal DCLK have a high level and, after a predetermined time delay, transitions to a low level. The NAND gate NA1 generates a signal a having a low level if both the feedback clock signal FCLK and the delay clock signal DCLK have a high level. A circuit which is formed by the delay DL1, the inverter I1 and the NOR gate NOR1 generates a signal b which transitions to a high level if both the signal a and the signal which inverts and delays the signal a have a low level and after a predetermined time delay transitions a low level.

The second phase detector 34 generates the first up signal CUP if the feedback is clock signal FCLK precedes in phase the delay clock signal DCLK and the first down signal CDN if the delay clock signal DCLK precedes in phase the feedback clock signal FCLK. When the first down signal CDN is generated, operation of the first phase detector 32 is disabled, and operation of the second phase detector 34 is enabled.

The delay DL2 delays the feedback clock signal FCLK. The latch LA2 generates a signal c having a low level and a signal d having a high level if an output signal of the delay DL2 has a high level and the delay clock signal DCLK has a low level and a signal c having a high level and a signal d having a low level if an output signal of the delay DL2 has a low level and the delay clock signal DCLK has a high level. The NAND gates NA10 and NA11 invert and output the signals c and d if the signal b has a high level and the first down signal CDN has a low level, respectively. That is, a signal having a high level and a signal having a low level are generated if the signals c and d respectively have a low level and a high level, and a signal having a low level and a signal having a high level are generated if the signals c and d respectively have a high level and a low level. The latch LA4 performs the same operation as the latch LA2 to generate the first down signal CDN and the first up signal CUP.

The first phase detector 32 is enabled in response to the first down signal DCN and generates the second up signal FUP if the feedback clock signal FCLK precedes in phase the delay clock signal DCLK and the second down signal FDN if the delay clock signal DCLK precedes in phase the feedback clock signal FCLK.

The latch LA1 generates a signal e having a low level and a signal f having a high level if an output signal of the delay DL2 has a high level and the delay clock signal DCLK has a low level and a signal e having a high level and a signal f having a low level is if an output signal of the delay DL2 has a low level and the delay clock signal DCLK has a high level. The NAND gates NA6 and NA7 invert and output the signals e and f if both the signal e and the first down signal CDN have a high level, respectively. That is, a signal having a high level and a signal having a low level are generated if the signals e and f respectively have a low level and a high level, and a signal having a low level and a signal having a high level are generated if the signals e and f respectively have a high level and a low level. The latch LA3 performs the same operation as the latch LA1 to generate the second down signal FDN and the second up signal FUP.

Figure 4:
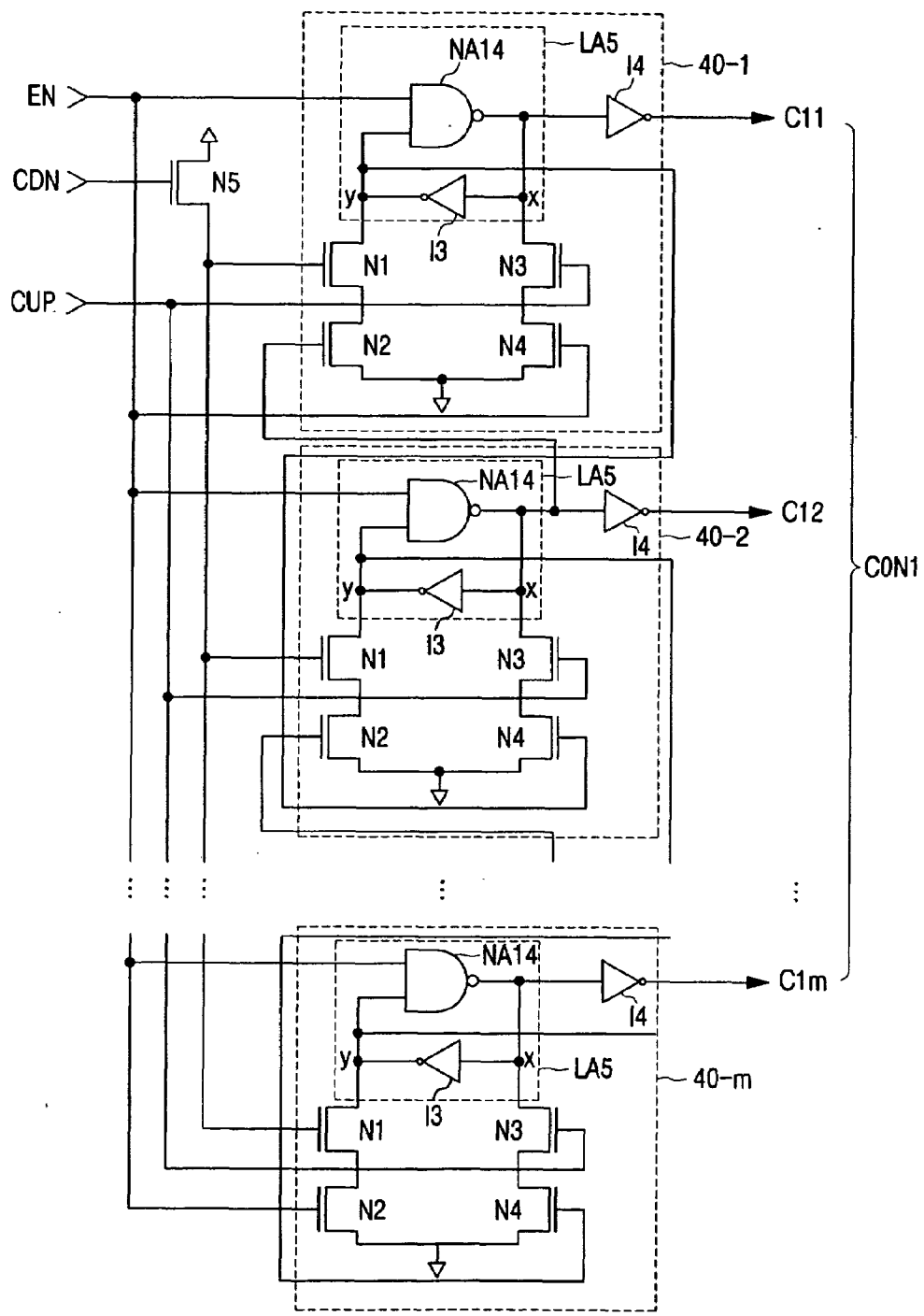
FIG. 4 is a circuit diagram illustrating a first counter of the delay locked loop of FIG. 2.

FIG. 4 is a circuit diagram illustrating the first counter of the delay locked loop of FIG. 2. The first counter includes m counting cells 40-1 to 40-m and an NMOS transistor N5, and each of the m counting cells 40-1 to 40-m includes a latch LA5 which is comprised of an NAND gate NA14 and an inverter I3, an inverter I4, and NMOS transistors N1 to N4.

In FIG. 4, an enable signal EN is a signal which transitions to a high level when a power voltage is applied, and C112 to C1m denote an m-bit first control signal CON1.

Operation of the first counter of FIG. 4 is explained below.

If an enable signal EN having a low level is initially applied, the counting output signals C11 to C1m maintain a low level. Then, if a power voltage is applied so that an enable signal EN having a high level is generated, the NMOS transistor N4 of the m counting cells 40-1 to 40-m is turned on. In this state, if the $1_{st}$ first up signal CUP having a high level is applied, the NMOS transistor N3 of the counting cell 40-1 is turned on, so that a node x becomes a low level. The inverter I4 inverts a signal having a low level at the node x to generate a first control signal C11 having a high level. The latch LA5 latches the signal having a low level at the node x, so that a node y becomes a high level. As a result, the NMOS transistor N4 of the counting cell 40-2 is turned on. At this time, the NMOS transistor N4 of the remainder of the counting cells 40-3 to 40-m maintains an off state.

In this state, if the $2_{nd}$ first up signal CUP having a high level is applied, the NMOS transistor N3 of each of the counting cells 40-1 and 40-2 is turned on, so that the node x becomes a low level. The inverter I4 inverts a signal having a low level at the node x to generate a first control signal C11 and C12 having a high level. The latch LA5 latches the signal having a low level at the node x, so that a node y becomes a high level. As a result, the NMOS transistor N4 of the counting cells 40-2 and 40-3 is turned on. At this time, the NMOS transistor N4 of the remainder of the counting cells 40-4 to 40-m maintains an off state.

In the manner described above, the first counter 14 increases the bit number of the first control signal C11 to C1m having a high level by one bit whenever the first up signal CUP transitions to a high level. That is, the first counter 14 changes the first control signal C11 to C1m in order of "0 . . . 000", "0 . . . 001", "0 . . . 011", . . . , "1 . . . 111".

If the first down signal CDN transitions to a high level in the state that the first control signal C11 to C1m is "0 . . . 011", the NMOS transistor N5 is turned on, so that a low level is applied to the NMOS transistor N1 of the m-counting cells 40-1 to 40-m and thus the NMOS transistor N1 is turned off. As a result, the counting cells 40-1 to 40-m maintain a signal latched by the latch LA5, and so the first control signal C11 to C1m is maintained as "0 . . . 011".

The first counter of FIG. 4 can perform the same operation in an alternative configuration in which the NMOS transistors N1 and N2 of the m counting cells 40-1 to 40-m are removed, and thus the first counter can have a configuration which does not include the NMOS transistors N1 and N2.

Figure 5:
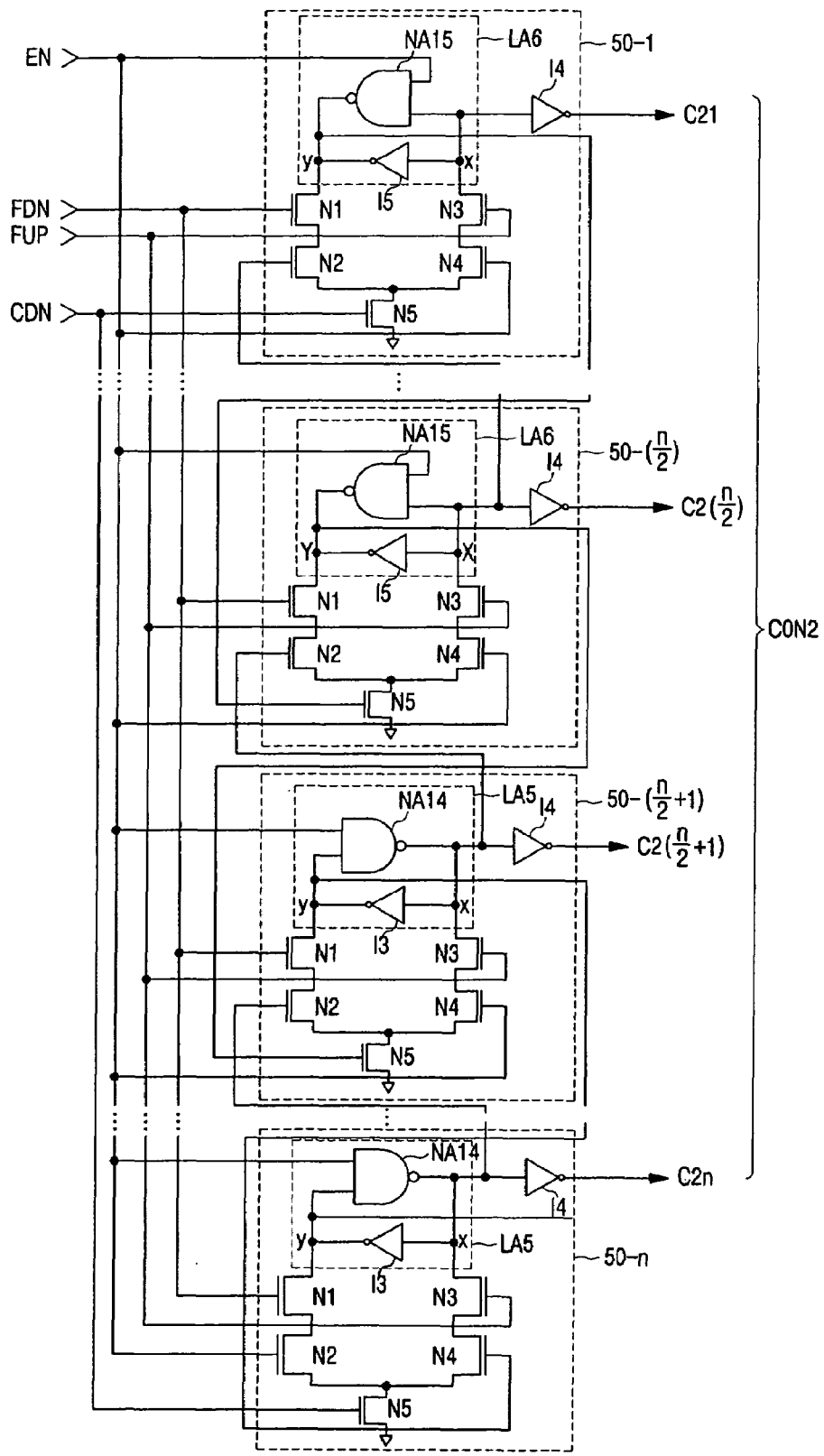
FIG. 5 is a circuit diagram illustrating a second counter of the delay locked loop of FIG. 2.

FIG. 5 is a circuit diagram illustrating the second counter of the delay locked loop of FIG. 2. The second counter of FIG. 5 includes n counting cells 50-1 to 50-n. Each of the counting cells 50-1 to 50-2/n includes a latch LA6 which is comprised of an NAND gate NA15 and an inverter I5, and NMOS transistors N1 to N5. Each of the counting cells 50-(2/n+1) to 50-n includes a latch LA5 which is comprised of an NAND gate NA14 and an inverter I3, and NMOS transistors N1 to N5.

In FIG. 5, the latch LA5 of the counting cells 50-(2/n+1) to 50-n is configured such that the NMOS transistor N5 is added to configuration of the m counting cells 40-1 to 40-m of FIG. 4, and the latch LA6 of the counting cells 50-1 to 50-2/n is configured such that the NAND gate NA14 and the inverter I3 which form the latch LA5 of the m counting cells 40-1 to 40-m of FIG. 4 are connected in the opposite direction and the NMOS transistor N5 is added.

Operation of the second counter of FIG. 5 is explained below.

If an enable signal EN having a low level is initially applied, the counting output signals C21 to C2(2/n) maintain a high level, and the counting output signals C2(2/n) to C2n maintain a low level. Then, if a power voltage is applied so that an enable signal EN having a high level is generated, the NMOS transistor N4 of the n counting cells 50-1 to 50-n is turned on, and if the first down signal CDN having a high level is generated, the NMOS transistor N5 is turned on, so that counting operation of the n counting cells 50-1 to 50-n is enabled. In this state, if the $1_{st}$ second up signal FUP having a high level is applied, the NMOS transistor N3 of the counting cell 50-(2/n+1) is turned on, so that a node x becomes a low level. The inverter I4 inverts a signal having a low level at the node x to generate a second control signal C2(2/n+1) having a high level. The latch LA5 latches the signal having a low level at the node x, so that a node y becomes a high level. As a result, the NMOS transistor N4 of the counting cell 50-(2/n+2) is turned on. At this time, the NMOS transistor N4 of the remaining counting cells 50-(2/n+3) to 50-n maintains an off state.

In this state, if the $2_{nd}$ second up signal FUP having a high level is applied, the counting cells 50-1 to 50-(2/n+3) generate the second control signal C21 to C2(2/n+3) having a high level, and the counting cells 50-(2/n+4) to 50-n generate the second control signal C2(2/n+4) to C2n having a low level.

In this state, if the $1_{st}$ second down signal FDN having a high level is applied, the counting cells 50-1 to 50-(2/n+2) generate the second control signal C21 to C2(2/n+2) having a high level, and the counting cells 50-(2/n+3) to 50-n generate the second control signal C2(2/n+3) to C2n having a low level.

In the way described above, the second counter 16 increases the bit number of the second control signal C21 to C2n having a high level by one bit whenever the second up signal FUP transitions to a high level. That is, the second counter 16 changes the second control signal C21 to C2n in order of "0 . . . 0001 . . . 1", "0 . . . 11 . . . 1", "0 . . . 111 . . . 1" if the second up signal FUP is continuously generated. Also, second counter 16 reduces the bit number of the second control signal C21 to C2n having a high level by one bit whenever the second down signal FDN transitions to a high level. That is, the second counter 16 changes the second control signal C21 to C2n in order of "0 . . . 0111 . . . 1", "0 . . . 0011 . . . 1", "0 . . . 0001 . . . 1" if the second down signal FDN is continuously generated.

Figure 6:
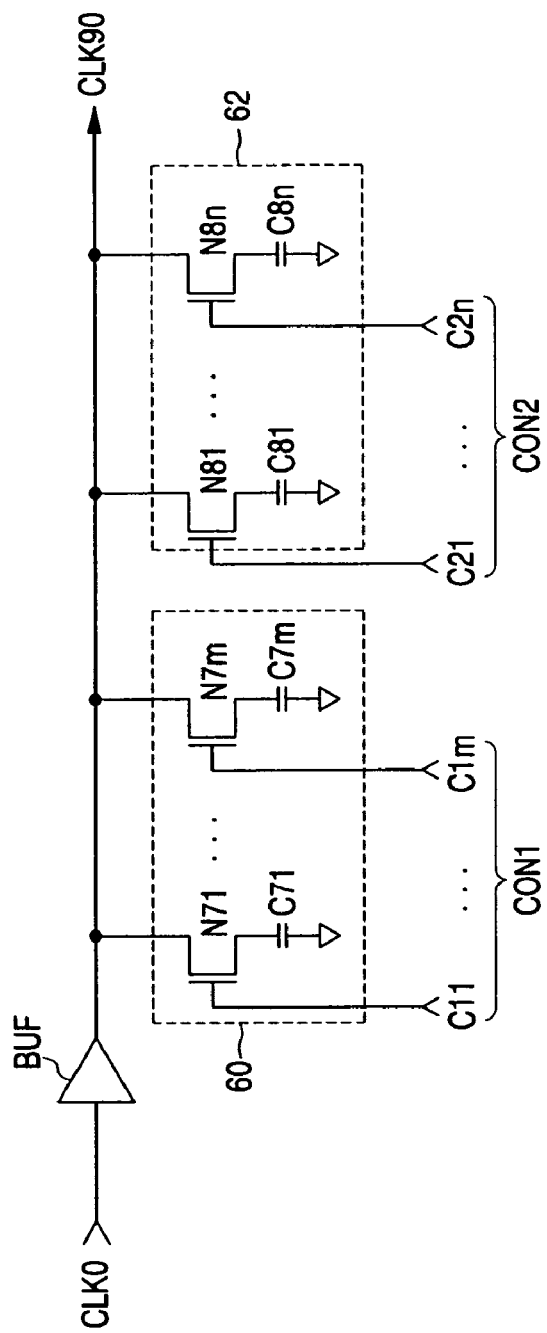
FIG. 6 is a block diagram illustrating a delay cell of the delay locked loop of FIG. 2.

FIG. 6 is a block diagram illustrating the delay cell of the delay locked loop of FIG. 2. The delay cell of FIG. 6 includes a buffer BUF, a first delay circuit 60, and a second delay circuit 62. The first delay circuit 60 includes NMOS transistors N71 to N7m and capacitors C71 to C7m, and the second delay circuit 62 includes NMOS transistors N81 to N8n and capacitors C81 to C8n.

The delay cell of FIG. 6 is a circuit which receives the clock signal CLK0 to generate the clock signal CLK90. Even though not shown, the reset delay cells have the same configuration.

Operation of the delay cell of FIG. 6 is explained below.

The buffer BUF buffers the clock signal CLK0. The NMOS transistors N71 to N7m are turned on respectively in response to the m-bit first control signal C11 to C1m to respectively connect the capacitors C71 to C7m to an output of the buffer BUF. The NMOS transistors N81 to N8n are turned on respectively in response to the n-bit second control signal C21 to C2n to respectively connect the capacitors C81 to C8n to an output of the buffer BUF. If all of the m-bit first control signal C11 to C1m have a high level, all of the NMOS transistors N71 to N7m and N81 to N8n are turned on, so that all of the capacitors C71 to C7m and C81 to C8n are connected to the output of the buffer BUF. Thus, the output of the buffer BUF has a maximum capacitance. On the other hand, if the m-bit first control signal C11 to C1m and the n-bit second control signal C21 to C2n have a low level, the output of the buffer BUF has a minimum capacitance. That is, as the bit number of the m-bit first control signal C11 to C1m and the n-bit second control signal C21 to C2n having a high level is increased, the capacitance of the output of the buffer is likewise increased, and a delay time of the output signal of the buffer BUF is increased.

In one embodiment of the delay cell of FIG. 6, n is greater than m, and the capacitance of each of the capacitors C71 to C7m is greater than the capacitance of each of the capacitors C81 to C8n. As a result, the delay time of the output signal of the buffer BUF is initially coarsely controlled to be relatively coarse in response to the m-bit first control signals C11 to C1m and then is finely controlled in response to the n-bit second control signal C21 to C2n.

Figure 7:
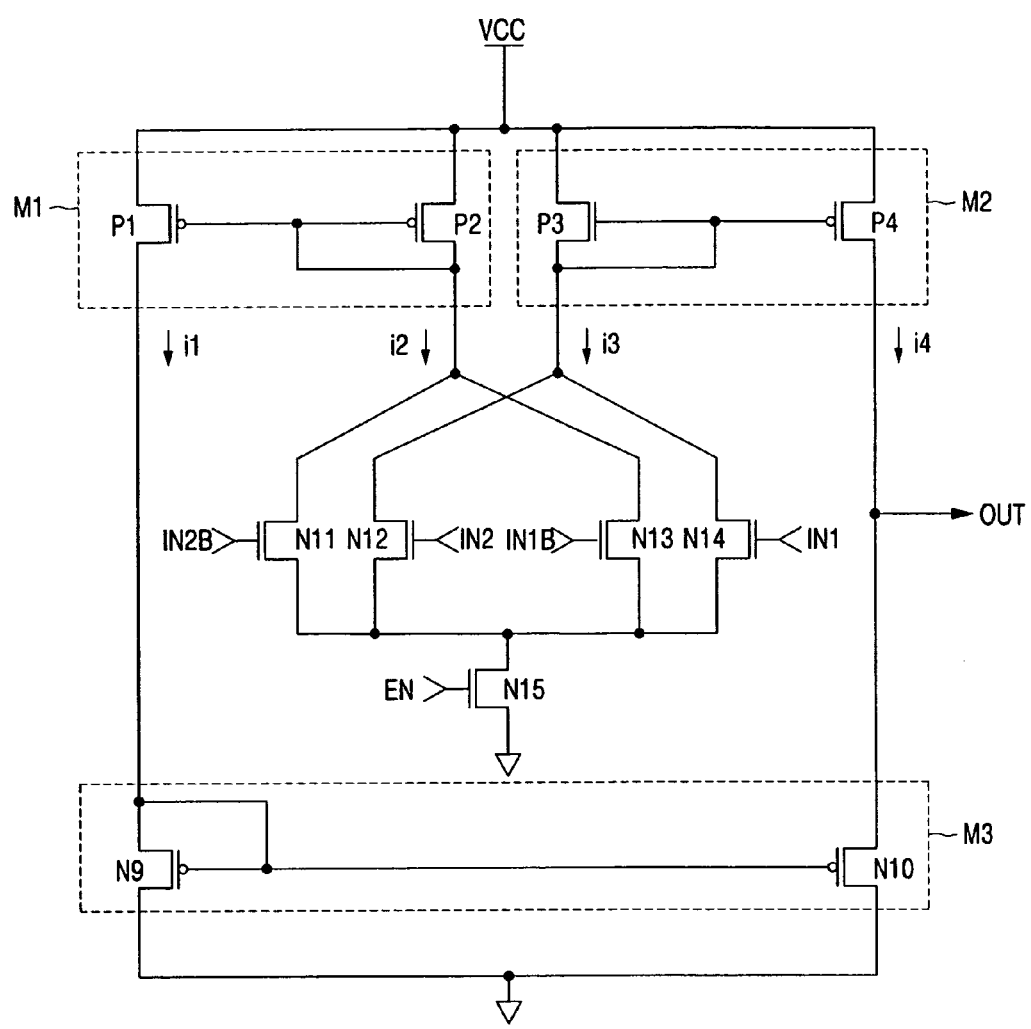
FIG. 7 is a circuit diagram illustrating a phase mixer of the delay locked loop of FIG. 2.

FIG. 7 is a circuit diagram illustrating the phase mixer of the delay locked loop of FIG. 2. The phase mixer of FIG. 7 includes PMOS transistors P1 to P4 and NMOS transistors N9 to N14. The PMOS transistors P1 and P2 form a first current mirror M1, the PMOS transistors P3 and P4 form a second current mirror M2, and the NMOS transistors N9 and N10 form a third current mirror M3.

In FIG. 7, an enable signal EN is a signal which transitions to a high level if a power voltage is applied like that of FIG. 4.

Operation of the phase mixer of FIG. 7 is explained below.

If all input signals IN1 and IN2 transition from a low level to a high level and all input signals IN1B and IN2B transition from a high level to a low level, a current i3 is increased, and a current i2 is reduced. As a result, the PMOS transistors P1 and P2 start to be turned off, and the PMOS transistors P3 and P4 start to be turned on, so that a current i1 starts to be reduced, and a current i4 starts to be increased. If the current i1 is reduced, the NMOS transistors N9 and N10 start to be turned off and are finally turned off. Thus, an output signal OUT transitions to a high level.

That is, the currents i2 and i3 are controlled by the input signals IN1 and IN2 and the input signals IN1B and IN2B, and the currents i1 and i4 are controlled by the currents i2 and i3. As a result, the output signal OUT having a high level is generated if the current i4 is greater than the current i1, and the output signal OUT having a low level is generated if the current i4 is smaller than the current i1.

If the input signals IN1 and IN2 are the clock signals CLK270 and CLKB90 and the input signals IN1B and IN2B are the clock signals CLK90 and CLKB270, the corrected clock signal CCLK90 is generated as the output signal OUT, and if the input signals IN1 and IN2 are the clock signals CLK90 and CLKB270 and the input signals IN1B and IN2B are the clock signals CLK270 and CLKB90, the corrected clock signal CCLK270 is generated as the output signal OUT. If the input signals IN1 and IN2 are the clock signal CLK180 and the input signals IN1B and IN2B are the clock signals CLKB180, the corrected clock signal CCLK0 is generated as the output signal OUT, and if the input signals IN1 and IN2 are the clock signals CLKB180 and the input signals IN1B and IN2B are the clock signals CLK180, the corrected clock signal CCLK180 is generated as the output signal OUT.

The phase mixer of FIG. 7 generates the currents i3 and i2 such that phases of the clock signals applied as the input signals IN1 and IN2 are mixed so that the phase change is offset and phases of the clock signals applied as the input signals IN1B and IN2B are mixed so that the phase change is offset, and also generates the output signal OUT such that the currents i3 and i2 generated by mixing the phases of the clock signals are mirrored to generate the currents i4 and i1.

Figure 8:
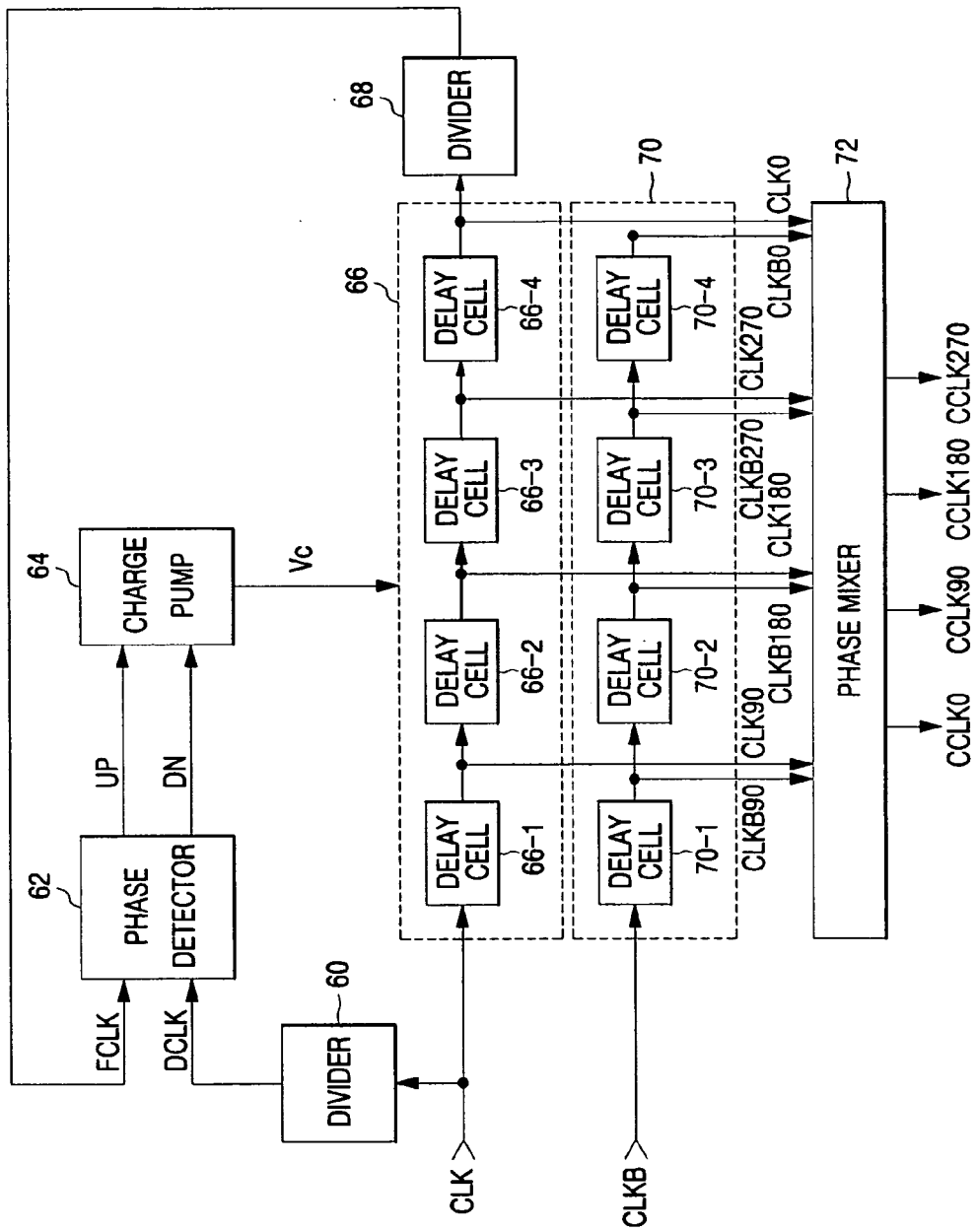
FIG. 8 is a block diagram illustrating a delay locked loop according to another embodiment of the present invention.

FIG. 8 is a block diagram illustrating a delay locked loop according to another embodiment of the present invention. The delay locked loop of FIG. 8 includes dividers 60 and 68, a phase detector 62, a charge pump 64, delay circuits 66 and 70, and a phase mixer 72. The delay circuit 66 includes delay cells 66-1 to 66-4, and the delay circuit 70 includes delay cells 70-1 to 70-4.

Functions of the components of FIG. 8 are explained below.

The divider 60 divides an externally applied clock signal CLK and generates a divided clock signal DCLK. The phase detector 62 detects a phase difference between a feedback clock signal FCLK and the divided clock signal DCLK and generates an up signal UP if a phase of the feedback clock signal precedes a phase of the divided clock signal DCLK and a down signal DN if a phase of the divided clock signal DCLK precedes a phase of the feedback clock signal. The charge pump 64 performs a pumping operation to raise a voltage Vc in response to the up signal UP and performs a pumping operation to drop a voltage Vc in response to the down signal DN. The delay circuit 66 receives a clock signal CLK and applies a voltage Vc as a power voltage of the delay cells 66-1 to 66-4, so that a delay time is controlled to generate four clock signals CLK0, CLK90, CLK180, and CLK270 which have a phase difference of 90° from each other. The delay circuit 70 receives an inverted clock signal CLKB and applies a voltage Vc as a power voltage of the delay cells 70-1 to 70-4, so that a delay time is controlled to generate four clock signals CLKB0, CLKB90, CLKB180, and CLKB270 which have a phase difference of 90° from each other. The divider 68 divides the clock signal output from the delay 66 to generate the feedback clock signal FCLK. The phase mixer 72 receives the clock signals CLK0, CLK90, CLK180, and CLK270 and the IS inverted clock signals CLKB0, CLKB90, CLKB180, and CLKB270 and mixes corresponding clock signals and inverted clock signals by two signals to generate corrected clock signals CCLK0, CCLK90, CCLK180, and CCLK270.

The delay locked loop of FIG. 1 controls the capacitance of the delay cells which form the delays 18 and 22 to change the delay time in response to a predetermined-bit first and second control signals, whereas the delay locked loop of FIG. 8 controls a power voltage applied to the delay cells which form the delays 66 and 70 to change the delay time in response to a voltage Vc.

The delay locked loop of the present invention receives the externally applied clock signals and the inverted clock signals to generate a plurality of clock signals and a plurality of inverted clock signals which have different phase differences and mixes corresponding clock signals and inverted clock signals to offset the transient phase change which occurs due to variation of the power voltage. Thus, the delay locked loop circuit of the present invention can generate a plurality of corrected clock signals which precisely have a phase difference of 90°.

Figure 9:
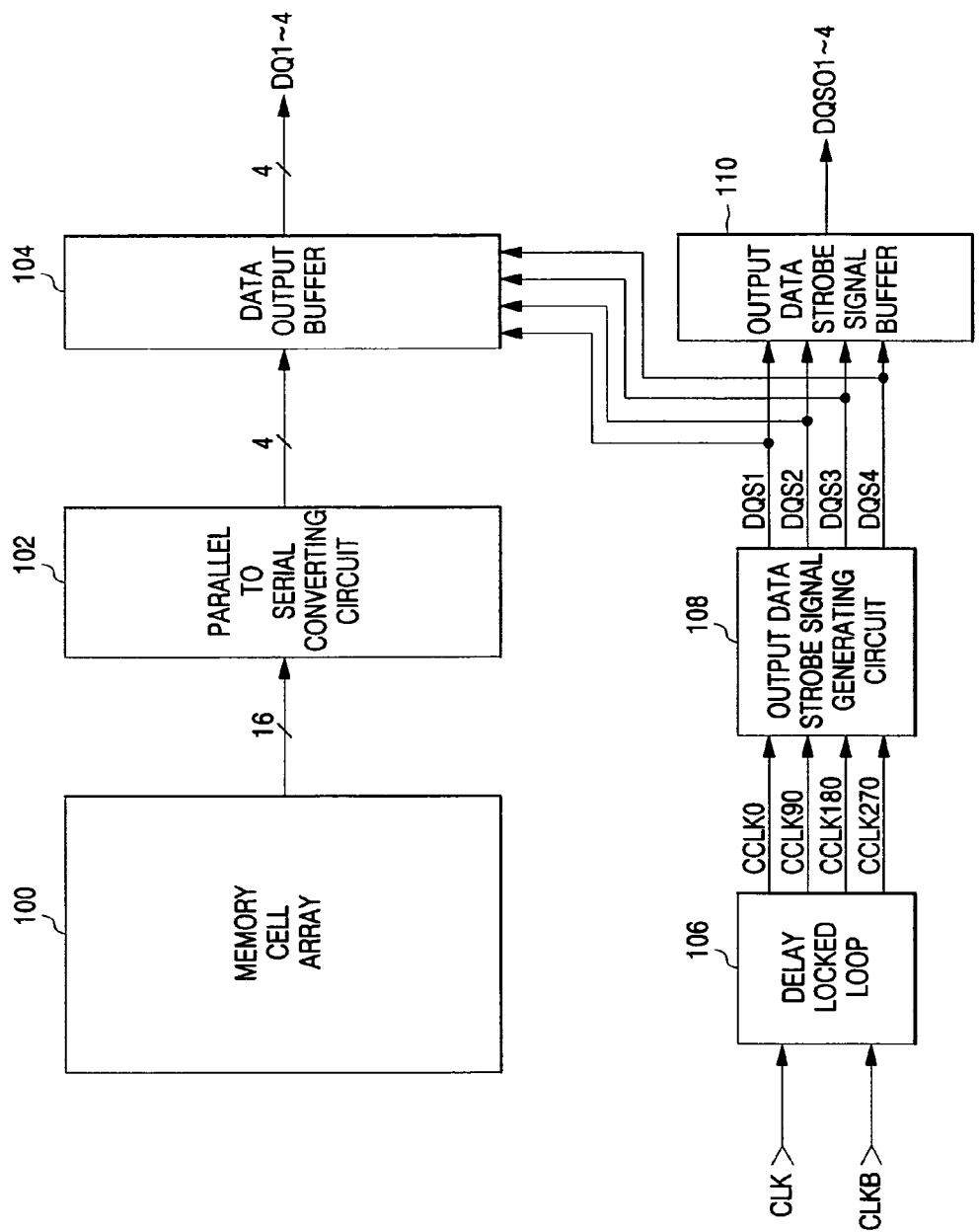
FIG. 9 is a block diagram illustrating a semiconductor memory device including the delay locked loop of the present invention.

FIG. 9 is a block diagram illustrating a semiconductor memory device having the delay locked loop circuit of the present invention. The semiconductor memory device of FIG. 9 includes a memory cell array 100, a parallel-to-serial converting circuit 102, a data output buffer 104, a delay locked loop 106, an output data strobe signal generating circuit 108, and an output data strobe signal buffer 110.

The semiconductor memory device of FIG. 9 has a burst length of 4 and outputs output data DQ1 to DQ4 four bits at a time in response to four output data strobe signals DQS1 to DQS4.

Functions of the components of FIG. 9 are explained below.

The memory cell array 100 outputs 16-bit data during read operation. The parallel-to-serial converting circuit 102 converts 16-bit parallel data into 4-bit serial data and outputs the serial data. The data output buffer 104 receives the 4-bit serial data and sequentially outputs output data DQ1 to DQ4 in response to respective data strobe signals DQS1 to DQS4. The delay locked loop 106 receives the clock signal CLK and the inverted clock signal CLKB and outputs the four corrected clock signals CCLK0, CCLK90, CCLK180, and CCLK270. The output data strobe signal generating circuit 108 combines the four corrected clock signals CCLK0, CCLK90, CCLK180, and CCLK270 by two to output four data strobe signals DQS1 to DQS4. For example, the data strobe signal DQS1 is generated by ANDing the corrected clock signals CCLK0 and CCLK270, the data strobe signal DQS2 is generated by ANDing the corrected clock signals CCLK0 and CCLK90, the data strobe signal DQS3 is generated by ANDing the corrected clock signals CCLK90 and CCLK180, and the data strobe signal DQS4 is generated by ANDing the corrected clock signals CCLK180 and CCLK270. The output data strobe signal buffer 110 buffers the four output data strobe signals DQS1 to DQS4 to generate output data strobe signals DQSO1 to DQSO4.

The delay locked loop circuit described above in connection with FIG. 2 or FIG. 8 is employed in the semiconductor memory device of FIG. 9 to generate the four corrected clock signals which precisely have a phase difference of 90° fro each other and combines the four corrected clock signals to generate four stable data strobe signals.

The embodiments of the present invention have been described above in connection with a delay locked loop circuit configuration that generates four clock signals; however, the present invention is equally applicable to a delay locked loop circuit that generates five or more clock signals.

As described hereinbefore, the delay locked loop of the present invention can generate a plurality of clock signals which have a precise phase difference therebetween by offsetting the phase change (noise) resulting from variation of the power voltage by phase mixing. Further, the semiconductor memory device having the delay locked loop according to the present invention can generate output data strobe signals which have a precise phase difference during a read operation.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A delay locked loop, comprising:
   a phase detecting and control signal generator for detecting a phase difference between a clock signal and a feedback clock signal and generating a plural-bit delay control signal which varies according to the phase difference;
   a first delay having a predetermined number of first delay cells which are cascade-connected for delaying the clock signal to generate a plurality of output clock signals and the feedback clock signal in response to the plural-bit delay control signal;
   a second delay having a predetermined number of second delay cells which are cascade-connected for delaying an inverted clock signal to generate a plurality of inverted output clock signals in response to the plural-bit delay control signal; and
   a phase mixer for phase-mixing corresponding clock signals among the plurality of output clock signals and the plurality of inverted output clock signals to output a plurality of corrected output clock signals.

2. The delay clocked loop of claim 1, wherein the phase detecting and control signal generator includes
   a first divider for dividing the clock signal to generate a divided clock signals;
   a second divider for dividing the feedback clock signal output from the first delay to generate a divided feedback clock signal;
   a phase detector for detecting a phase difference between the divided clock signal and the divided feedback clock signal to generate a phase detecting signal; and
   a counting portion for performing a counting operation in response to the phase detecting signal to generate the plural-bit control signal.

3. The delay locked loop of claim 2, wherein the phase detector generates as the phase detecting signal a first up signal if the divided clock signal precedes in phase the divided feedback clock signal and a first down signal if the divided feedback clock signal precedes in phase the divided clock signal, at an initial stage, and generates, after the first down signal is generated, a second up signal if the divided clock signal precedes in phase the divided feedback clock signal and a second down signal if the divided feedback clock signal precedes in phase the divided clock signal.

4. The delay locked loop of claim 3, wherein the counting portion includes
   a first counter for performing an up counting operation in response to the first up signal to generate a predetermined-bit first control signal; and
   a second counter for being enabled in response to the first down signal, performing an up counting operation in response to the second up signal, and performing a down counting operation in response to the second down signal to generate a predetermined-bit second control signal;
   wherein the plural-bit control signal is comprised of the predetermined-bit first and second control signals.

5. The delay locked loop of claim 4, wherein each of the predetermined number of first delay cells includes
   a first buffer for delaying an output signal of a previous delay cell; and
   a plurality of first switching transistor and first capacitor pairs which are parallel-connected to each other, the first switching transistor and first capacitor pair serially connected between an output end of the first buffer and a ground voltage,
   wherein each of the plurality of first switching transistors is switched in response to the predetermined-bit first control signal.

6. The delay locked loop of claim 4, wherein each of the predetermined number of second delay cells includes
   a second buffer for delaying an output signal of a previous delay cell; and
   a plurality of second switching transistor and second capacitor pairs which are parallel-connected to each other, the second switching transistor and second capacitor pair serially connected between an output end of the second buffer and a ground voltage,
   wherein each of the plurality of second switching transistors is switched in response to the predetermined-bit second control signal.

7. The delay locked loop of claim 4, wherein the first counter includes a predetermined number of first counting cells for generating respective bits of the predetermined-bit first control signal, wherein the first counting cells generate the predetermined-bit first control signals having a low level at an initial stage and perform up counting operation in response to the first up signal to increase the bit number of the predetermined-bit first control signal having a high level.

8. The delay locked loop of claim 7, wherein each of the predetermined number of first counting cells includes
   a latch for initially outputting data having a high level to a first node, inverting data of the first node and outputting to a second node, and inverting data of the second node and outputting to the first node; and
   a reset circuit for making the first node have a low level in response to the first up signal and a signal of the second node of a next counting cell.

9. The delay locked loop of claim 4, wherein the second counter includes a predetermined number of second counting cells for generating respective bits of the predetermined-bit second control signal, and the second counting cells generate the predetermined-bit second control signal an upper bit of which has a high level and a remainder of bits of which have a low level, are enabled in response to the first down signal, perform an up counting operation in response to the second up signal to increase the bit number of the predetermined-bit second control signal having a high level, and perform a down counting operation in response to the second down signal to reduce the bit number of the predetermined-bit second control signal having a high level.

10. The delay locked loop of claim 9, wherein each of the predetermined number of first counting cells includes
    a latch for initially outputting data having a high level to a first node, inverting data of the first node and outputting to a second node, and inverting data of the second node and outputting to the first node;
    a first reset circuit for setting the first node to a low level in response to the first up signal and a signal of the second node of a next counting cell;
    a second reset circuit for setting the second node to a low level in response to the second down signal and a signal of the first node of a previous counting cell; and
    an enable circuit for providing the first and second reset circuits with a low level in response to the first down signal.

11. The delay locked loop of claim 1, wherein the phase mixer generates a plurality of corrected output clock signals by phase-mixing an output clock signal and an inverted output clock signal which have the same phase and different phase change among the plurality of output clock signals and the plurality of inverted output clock signals.

12. The delay locked loop of claim 11, wherein the phase mixer includes
- a first current generator for generating a first current in response to first and second input signals;
- a second current generator for generating a second current in response to third and fourth input signals;
- a first current mirror for mirroring the first current to generate a third current;
- a second current mirror for mirroring the second current to generate a fourth current;
- a third current mirror for mirroring the fourth current to generate an output voltage,
- wherein among the plurality of output clock signals and the plurality of inverted output clock signals, an output clock signal and an inverted output clock signal which have the same phase and different phase change are the first and second input signals, and an output clock signal and an inverted output clock signal which have opposite phase and different phase change are the third and fourth input signals.

13. A delay locked loop, comprising:
- a phase detecting and control signal generator for detecting a phase difference between a clock signal and a feedback clock signal and generating a control voltage which varies according to the phase difference;
- a first delay having a predetermined number of first delay cells which are cascade-connected for delaying the clock signal to generate a plurality of output clock signals and the feedback clock signal in response to the control voltage;
- a second delay having a predetermined number of second delay cells which are cascade-connected for delaying an inverted clock signal to generate a plurality of inverted output clock signals in response to the control voltage; and
- a phase mixer for phase-mixing corresponding clock signals among the plurality of output clock signals and the plurality of inverted output clock signals to output a plurality of corrected output clock signals.

14. The delay clocked loop of claim 13, further comprising,
- a first divider for dividing the clock signal to generate a divided clock signals;
- a second divider for dividing the feedback clock signal output from the first delay to generate a divided feedback clock signal;
- a phase detector for detecting a phase difference between the divided clock signal and the divided feedback clock signal to generate a phase detecting signal; and
- a charge pump for performing a pumping operation in response to the phase detecting signal to generate the control voltage.

15. The delay clocked loop of claim 14, wherein the phase detector generates as the phase detecting signal an up signal if the divided clock signal precedes in phase the divided feedback clock signal and a down signal if the divided feedback clock signal precedes in phase the divided clock signal.

16. The delay clocked loop of claim 13, wherein each of the predetermined number of first delay cells includes a first buffer and applies as a power voltage of the first buffer the control voltage to control a delay time.

17. The delay clocked loop of claim 13, wherein each of the predetermined number of second delay cells includes a second buffer and applies as a power voltage of the second buffer the control voltage to control a delay time.

18. The delay clocked loop of claim 14, wherein the phase mixer generates a plurality of corrected output clock signals by phase-mixing an output clock signal and an inverted output clock signal which have the same phase and different phase change among the plurality of output clock signals and the plurality of inverted output clock signals.

19. The delay locked loop of claim 18, wherein the phase mixer includes
- a first current generator for generating a first current in response to first and second input signals;
- a second current generator for generating a second current in response to third and fourth input signals;
- a first current mirror for mirroring the first current to generate a third current;
- a second current mirror for mirroring the second current to generate a fourth current;
- a third current mirror for mirroring the fourth current to generate an output voltage,
- wherein among the plurality of output clock signals and the plurality of inverted output clock signals, an output clock signal and an inverted output clock signal which have the same phase and different phase change are the first and second input signals, and an output clock signal and an inverted output clock signal which have opposite phase and different phase change are the third and fourth input signals.

20. A semiconductor memory device, comprising:
- a delay locked loop for receiving a clock signal and an inverted clock signal to generate a plurality of corrected output clock signals; and
- an output data strobe signal generator for combining the plurality of corrected output clock signals to generate a plurality of output data strobe signals,
- wherein the delay locked loop includes:
- a phase detecting and control signal generator for detecting a phase difference between the clock signal and a feedback clock signal and generating a plural-bit delay control signal which varies according to the phase difference;
- a first delay having a predetermined number of first delay cells which are cascade-connected for delaying the clock signal to generate a plurality of output clock signals and the feedback clock signal in response to the plural-bit delay control signal;
- a second delay having a predetermined number of second delay cells which are cascade-connected for delaying an inverted clock signal to generate a plurality of inverted output clock signals in response to the plural-bit delay control signal; and
- a phase mixer for phase-mixing corresponding clock signals among the plurality of output clock signals and the plurality of inverted output clock signals to output a plurality of corrected output clock signals.

21. The device of claim 20, wherein the phase detecting and control signal generator includes
- a first divider for dividing the clock signal to generate a divided clock signals;
- a second divider for dividing the feedback clock signal output from the first delay to generate a divided feedback clock signal;
- a phase detector for detecting a phase difference between the divided clock signal and the divided feedback clock signal to generate a phase detecting signal; and
- a counting portion for performing a counting operation in response to the phase detecting signal to generate the plural-bit control signal.

22. The device of claim 21, wherein the phase detector generates as the phase detecting signal a first up signal if the divided clock signal precedes in phase the divided feedback clock signal and a first down signal if the divided feedback clock signal precedes in phase the divided clock signal, at an initial stage, and generates, after the first down signal is generated, a second up signal if the divided clock signal precedes in phase the divided feedback clock signal and a second down signal if the divided feedback clock signal precedes in phase the divided clock signal.

23. The device of claim 21, wherein the counting portion includes
a first counter for performing an up counting operation in response to the first up signal to generate a predetermined-bit first control signal; and
a second counter for being enabled in response to the first down signal, performing an up counting operation in response to the second up signal, and performing a down counting operation in response to the second down signal to generate a predetermined-bit second control signal;
wherein the plural-bit control signal is comprised of the predetermined-bit first and second control signals.

24. The device of claim 23, wherein each of the predetermined number of first delay cells includes
a first buffer for delaying an output signal of a previous delay cell; and
a plurality of first switching transistor and first capacitor pairs which are parallel-connected to each other, the first switching transistor and first capacitor pair serially connected between an output end of the first buffer and a ground voltage,
wherein each of the plurality of first switching transistors is switched in response to the predetermined-bit first control signal.

25. The device of claim 23, wherein each of the predetermined number of second delay cells includes
a second buffer for delaying an output signal of a previous delay cell; and
a plurality of second switching transistor and second capacitor pairs which are parallel-connected to each other, the first switching transistor and first capacitor pair serially connected between an output end of the second buffer and a ground voltage,
wherein each of the plurality of second switching transistors is switched in response to the predetermined-bit second control signal.

26. The device of claim 23, wherein the first counter includes a predetermined number of first counting cells for generating respective bits of the predetermined-bit first control signal, wherein the first counting cells generate the predetermined-bit first control signals having a low level at an initial stage and perform up counting operation in response to the first up signal to increase the bit number of the predetermined-bit first control signal having a high level.

27. The device of claim 23, wherein the second counter includes a predetermined number of second counting cells for generating respective bits of the predetermined-bit second control signal, and the second counting cells generate the predetermined-bit second control signal an upper bit of which has a high level and a remainder of the bits of which have a low level, are enabled in response to the first down signal, perform an up counting operation in response to the second up signal to increase the bit number of the predetermined-bit second control signal having a high level, and perform a down counting operation in response to the second down signal to reduce the bit number of the predetermined-bit second control signal having a high level.

28. The device of claim 20, wherein the phase mixer generates a plurality of corrected output clock signals by phase-mixing an output clock signal and an inverted output clock signal which have the same phase and different phase change among the plurality of output clock signals and the plurality of inverted output clock signals.

29. The device of claim 28, wherein the phase mixer includes
a first current generator for generating a first current in response to first and second input signals;
a second current generator for generating a second current in response to third and fourth input signals;
a first current mirror for mirroring the first current to generate a third current;
a second current mirror for mirroring the second current to generate a fourth current;
a third current mirror for mirroring the fourth current to generate an output voltage,
wherein among the plurality of output clock signals and the plurality of inverted output clock signals, an output clock signal and an inverted output clock signal which have the same phase and different phase change are the first and second input signals, and an output clock signal and an inverted output clock signal which have opposite phase and different phase change are the third and fourth input signals.

30. A semiconductor memory device, comprising:
a delay locked loop for receiving a clock signal and an inverted clock signal to generate a plurality of corrected output clock signals; and
an output data strobe signal generator for combining the plurality of corrected output clock signals to generate a plurality of output data strobe signals,
wherein the delay locked loop includes
a phase detecting and control signal generator for detecting a phase difference between the clock signal and a feedback clock signal and generating a control voltage which varies according to the phase difference;
a first delay having a predetermined number of first delay cells which are cascade-connected for delaying the clock signal to generate a plurality of output clock signals and the feedback clock signal in response to the control voltage;
a second delay having a predetermined number of second delay cells which are cascade-connected for delaying an inverted clock signal to generate a plurality of inverted output clock signals in response to the control voltage; and
a phase mixer for phase-mixing corresponding clock signals among the plurality of output clock signals and the plurality of inverted output clock signals to output a plurality of corrected output clock signals.

31. The device of claim 30, further comprising,
a first divider for dividing the clock signal to generate a divided clock signals;
a second divider for dividing the feedback clock signal output from the first delay to generate a divided feedback clock signal;
a phase detector for detecting a phase difference between the divided clock signal and the divided feedback clock signal to generate a phase detecting signal; and
a charge pump for performing pumping operation in response to the phase detecting signal to generate the control voltage.

32. The device of claim 31, wherein the phase detector generates as the phase detecting signal an up signal if the divided clock signal precedes in phase the divided feedback clock signal and a down signal if the divided feedback clock signal precedes in phase the divided clock signal.

33. The device of claim 30, wherein each of the predetermined number of first delay cells includes a first buffer and applies as a power voltage of the first buffer the control voltage to control a delay time.

34. The device of claim 30, wherein each of the predetermined number of second delay cells includes a second buffer and applies as a power voltage of the second buffer the control voltage to control a delay time.

35. The device of claim 30, wherein the phase mixer generates a plurality of corrected output clock signals by phase-mixing an output clock signal and an inverted output clock signal which have the same phase and different phase change among the plurality of output clock signals and the plurality of inverted output clock signals.

36. The device of claim 35, wherein the phase mixer includes a first current generator for generating a first current in response to first and second input signals;

a second current generator for generating a second current in response to third and fourth input signals;

a first current mirror for mirroring the first current to generate a third current;

a second current mirror for mirroring the second current to generate a fourth current;

a third current mirror for mirroring the fourth current to generate an output voltage, wherein among the plurality of output clock signals and the plurality of inverted output clock signals, an output clock signal and an inverted output clock signal which have the same phase and different phase change are the first and second input signals, and an output clock signal and an inverted output clock signal which have opposite phase and different phase change are the third and fourth input signals.

* * * * *

UNITED STATES PATENT AND TRADEMARK OFFICE
CERTIFICATE OF CORRECTION

| | |
|---|---|
| PATENT NO. | : 7,202,721 B2 |
| APPLICATION NO. | : 11/265945 |
| DATED | : April 10, 2007 |
| INVENTOR(S) | : Young-Jin Jeon |

It is certified that error appears in the above-identified patent and that said Letters Patent is hereby corrected as shown below:

Column 15, line 40 delete "clocked" and insert --locked--

Column 15, line 54 delete "clocked" and insert --locked--

Column 15, line 60 delete "clocked" and insert --locked--

Column 15, line 64 delete "clocked" and insert --locked--

Column 16, line 1 delete "clocked" and insert --locked--

Signed and Sealed this

Eighteenth Day of September, 2007

JON W. DUDAS
*Director of the United States Patent and Trademark Office*